United States Patent [19]

Peng et al.

[11] Patent Number: 5,561,293
[45] Date of Patent: Oct. 1, 1996

[54] METHOD OF FAILURE ANALYSIS WITH CAD LAYOUT NAVIGATION AND FIB/SEM INSPECTION

[75] Inventors: Yeng-Kaung Peng, Saratoga; Thao H. Vo, Santa Clara; Paul M. Wong, Milpitas, all of Calif.

[73] Assignee: Advanced Micro Devices, Inc., Sunnyvale, Calif.

[21] Appl. No.: 425,110

[22] Filed: Apr. 20, 1995

[51] Int. Cl.$^6$ ................................................ H01J 37/00
[52] U.S. Cl. .......................................................... 250/307
[58] Field of Search ................................ 250/307, 306, 250/309, 310, 492.1, 492.2, 492.3

[56] References Cited

U.S. PATENT DOCUMENTS 5,214,283  5/1993  Le ............................................ 250/307

*Primary Examiner*—Jack I. Berman
*Assistant Examiner*—Kiet T. Nguyen

[57] ABSTRACT

A method of analyzing a failure of a sample, such as a wafer or a package unit made from a die sliced from the wafer, uses a computer aided design (CAD) tool in conjunction with a dual beam scanner and reverse engineering to improve the yield of the product. The computer aided design tool provides navigation to a location of interest over a layout of a wafer sample which has failed a test. The location of interest of the sample is then inspected using the dual beam scanner. The inspection may be made with either a focused ion beam scan or with a scanning electron microscope scan to provide different types of scan images and information. After inspection, a reverse engineering process (stripping back) is performed on the sample and the sample is inspected again to determine the cause of the failure of the sample. Once the cause of the failure is determined, the manufacturing process can be changed to improve the yield of the wafers.

19 Claims, 3 Drawing Sheets

METHOD OF FAILURE ANALYSIS WITH CAD LAYOUT NAVIGATION AND FIB/SEM INSPECTION

BACKGROUND OF THE INVENTION

1. Technical Field of the Invention

The present invention relates to the field of failure analysis, and more particularly, to the analysis of failures in a sample, such as a wafer or a die sliced from the wafer.

2. Description of Related Art

The manufacturers of semiconductor devices, whether these devices are still in wafer form or package form, will normally test the semiconductor devices before their shipment. The vast majority of these tests are electrical in nature. Occasionally, some of the devices will fail the testing procedures. It is also possible that a device fails tests performed by a customer before or after installation in a product. These failing circuits are then shipped back to the manufacturer for failure analysis. It is important for the manufacturer to understand the cause of the failures in order to improve the yield of the devices.

The failures are separated into two main categories, either functional failures or DC failures. The functional failures occur when a sample does not respond properly to generated functions that are applied to the circuit. The DC failures are identified by the presence of shorts, leakage current, etc. in response to imposed test conditions.

In order to determine the cause of a failure, the possible areas where failures are caused in the circuit need to be identified. Hence, steps are performed to identify "hot spots" in the sample. These steps include, for instance, the use of an emission microscope that detects heat, or the coating of the sample with liquid crystal. With either of these methods, the test conditions at which the sample failed are again applied to the sample and the hot spots are noted and recorded. For example, the sample and its hot spots may be photographed to provide a visual record of the hot spot locations. After the hot spots are identified in the photograph, the integrated circuit is then scanned by a scanning electron microscope, or is optically inspected using an optical microscope. This inspection is done in order to detect any obvious defects prior to performing reverse engineering.

When the initial inspection of the sample under the scanning electron microscope or optical microscope does not reveal any obvious defects, reverse engineering is performed in order to strip back the sample layer by layer. The stripping may be done either by a dry etch technique, such as reactive ion etching, or a wet etch technique. After each layer has been stripped, the sample (the integrated circuit package or wafer) is returned to the scanning electron microscope or optical microscope and once again inspected for defects. A defect is normally recognized by either a particle or a hole or some type of broken metal in the sample. The cause of the failure of the sample will thus be identified.

One of the problems of this known method for analyzing the failures of a sample is the requirement that entire layers be stripped from the sample prior to re-inspection under the scanning electron microscope or optical microscope. This is due to the fact that when scanning with a scanning electron microscope, only the surface layers are visible so that stripping by surface layers is required to reveal defects.

SUMMARY OF THE INVENTION

There is a need for a method of analyzing the failure of a sample, such as a wafer or an integrated circuit package, which does not require the stripping of a whole layer from the sample and which provides a high precision of movement to the failing locations.

These and other needs are met by the present invention which provides a method of analyzing a failure of a sample, this method comprising the steps of: (a) navigating over a layout of the sample to a location of interest using a computer aided design tool; (b) inspecting the location of interest of the sample using a dual beam scanner; (c) performing a reverse engineering process on the sample at the location of interest; and (d) repeating steps (a) and (b) to determine the cause of the failure of the sample.

The use of a computer aided design tool to navigate over a layout of the sample, and the inspection of the sample using a dual beam scanner provide high precision scanning via the navigation step to the failing locations. Furthermore, the process layers may be selectively inspected at the failing locations prior to reverse engineering in order to expedite the reverse engineering process.

The dual beam scanner, in preferred embodiments, uses a focused ion beam scanner as one of the dual beams. The focused ion beam scanner provides more detail than a scanning electron microscope image, such as the grain structure, different materials, etc. Furthermore, the focused ion beam machine may operate very locally to cut a hole in a location of interest. This hole can be, for example, ten microns by ten microns. Cross-sections of the sample may then be viewed. This obviates the requirement of stripping a whole layer from the sample in many circumstances.

The foregoing and other features, aspects and advantages of the present invention will become more apparent from the following detailed description of the present invention when taken in conjunction with the accompanying drawings.

DETAILED DESCRIPTION OF THE ILLUSTRATIVE EMBODIMENTS

Figure 1:
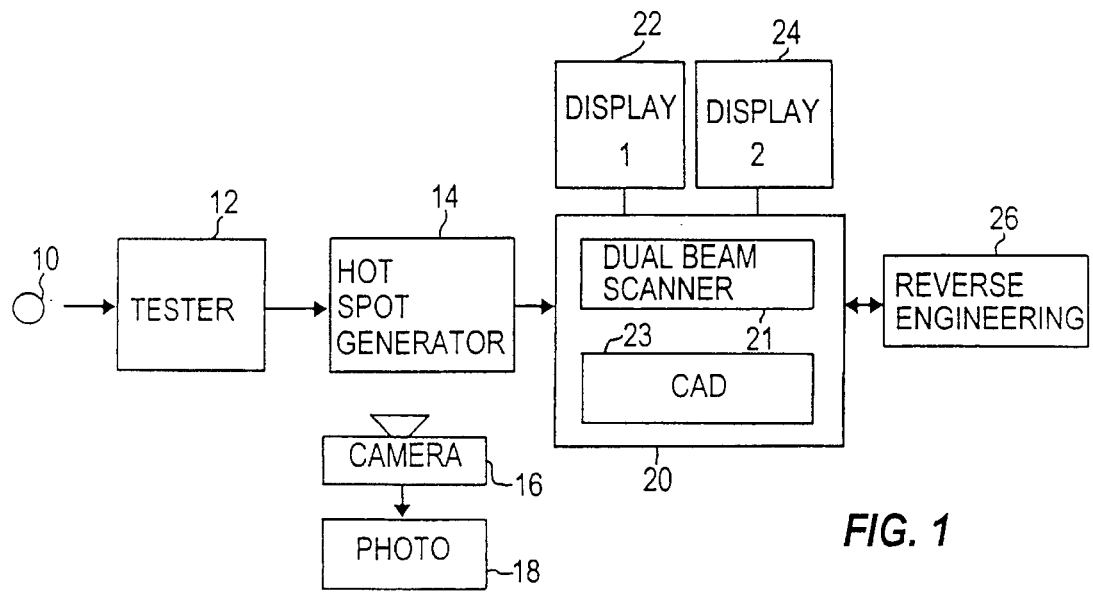
FIG. 1 is a block diagram of a system for testing samples and analyzing failed samples constructed in accordance with an embodiment of the present invention.

The embodiment of a system in accordance with the present invention for testing a sample, such as a wafer or package unit containing an integrated circuit, is provided by FIG. 1. The sample 10, which may be for example, a wafer or a package unit containing an integrated circuit sliced from the wafer, is tested by an automatic tester 12. The tester 12 can be, for example, a J953 or J971 tester manufactured by Teradyne Inc. of Massachusetts, and is used to verify the functionality of the sample 10. Samples that pass the test are provided for shipping or assembly in a product. Those samples which fail, however, are subjected to the failure analysis method of the present invention.

A sample will fail either functionally or undergo a DC failure. A functional failure occurs when the circuitry of the sample fails to respond correctly to functional tests, i.e., with proper output signals in response to specific input signals. A DC failure occurs when there is leakage, a short, improper output voltage levels, etc. in response to different test conditions.

The failing sample 10 is then provided to a hot spot generator 14 which applies the test condition which caused the sample 10 to fail the earlier testing procedure. This will cause the sample 10 to generate one or more hot spots on the sample. The sample 10 is photographed or otherwise optically recorded by, for example, a camera 16. The photograph 18 produced by the camera 16 of the sample 10 with the hot spots is used to identify locations of interest on the sample 10 that should be investigated.

Figure 2:
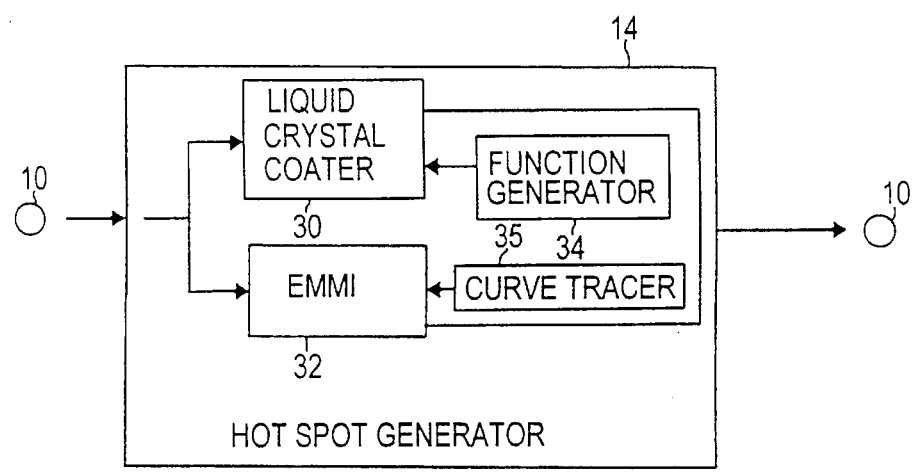
FIG. 2 is a block diagram of an embodiment of a hot spot generator used in the system of FIG. 1.

The hot spot generator 10 may either coat the sample 10 with a liquid crystal prior to the application of the test condition, or an emission microscope (EMMI) may be used to detect the hot spots. This is illustrated in more detail by the block diagram of FIG. 2 in which the sample 10 is either provided to a liquid crystal coater 30 or to an emission microscope 32 prior to the sample being subjected to the test conditions by a function generator 34 or a curve tracer 35. The function generator 34 is used when the sample failed a functional test and the curve tracer 35 is used when the sample is categorized with a DC failure.

The application of liquid crystal material to a sample to detect hot spots is well known. Furthermore, the emission microscope 32, which detects heat on a sample, is a commercially available device (Visionary 2) manufactured by Hypervision of California. The function generator 34 may be any of a number of different commercially available function generators, one example being a function generator (Logic Master XL 60) manufactured by IMS Inc. of Oregon. A curve tracer that may be used, for example, is commercially available from Tektronik Corporation of Oregon.

Once the hot spots are located and photographed, the sample 10 is inspected by an inspection tool 20 having a dual beam scanner 21 coupled with a computer aided design (CAD) tool 23. The dual beam scanner 21 can be, for example, a dual beam scanner (SMI 8800SE) manufactured by Seiko of Japan. The computer aided design tool 23 may use commercially available navigation software sold by Knights Technology of California, entitled Merlin Framework, Version 4.0, with Maskview/Seiko version 5.3 running within Merlin Framework to allow the computer aided design tool 23 to communicate with the dual beam scanner 21. The computer aided design tool 23 provides the layout data for the circuit of the sample 10 that is being inspected. A Sun Sparc 10 computer manufactured by Sun Microsystems may be used, for example, to implement the computer aided design tool 23.

The dual beam scanner 21 that is used in preferred embodiments of the present invention is able to scan a sample with either a focused ion beam (FIB) or a scanning electron microscope (SEM) to provide two different types of scanning. As discussed earlier, a focused ion beam provides a different type of image than a scanning electron microscope, which normally provides images of surface layers only. Furthermore, the focused ion beam can be used to provide very localized cutting of the sample to thereby avoid the need for removal of an entire layer or layers in certain instances.

The inspection tool 20 is coupled to first and second displays 22, 24 so that corresponding images from the dual beam scanner 21 and the computer aided design tool 23 are simultaneously displayed side-by-side. The images correspond to each other (i.e. are synchronized to display the same portion of the sample). Hence, as a user inspects one portion of the device using the dual beam scanner 21 with either of the FIB or SEM scans, this is displayed on a first display 22. At the same time, the user will see on display 24 a layout of the circuit in this same location.

An inspection tool using a single, secondary election beam scanner with a computer aided design tool has been used to debug a new integrated circuit design, but has not been used in conjunction with the reverse engineering process for failure analysis in order to improve yield. Once a chip design has been debugged using the inspection tool, the inspection tool is no longer used. By contrast, with the present invention, the design is already complete and the inspection tool is used with a reverse engineering process in order to find the root cause of defects of wafers. Once the root cause is found, the manufacturing process of the wafers may be altered in order to improve the yield of the wafers. The entire method of the present invention is used as an ongoing procedure for yield improvement until the end of the integrated circuit manufacturing process.

In the embodiment of the present invention depicted in FIG. 1, after the initial inspection of the hot spots using the inspection tool 20 in order to determine whether there are any obvious defects, a reverse engineering process is performed using reverse engineering tool 26. The reverse engineering tools can include, for example, a reactive ion etcher (RIE) such as a CS 1701 manufactured by March Instruments Inc. of California, or the process can be performed with a wet etch technique. The reverse engineering process is also known as "stripping back". This involves removing one or more layers from the sample 10. After removal of the layer, the sample 10 is returned to the inspection tool 20. Because the coordinates of the location of interest (or the hot spot) that was identified have been stored using the navigation software of the computer aided design tool, the same failure location may be quickly and accurately returned to after the stripping back of a layer.

The identification of the location of the failure within the circuit layout allows the user to understand the failure mode in an electrical sense while at the same time viewing the physical location on the sample 10. The use of the dual beam scanner 21 allows for failure analysis and inspection of the sample 10 from either a surface layer or a cross-sectional point of view since cross-sections can be made using the focused ion beam.

Some of the different types of failures that are identifiable by the present invention include poly notching in which the polysilicon is notched; an embedded particle (contamination) in the sample; a metal short; a filament; or a junction leakage.

Figure 4:
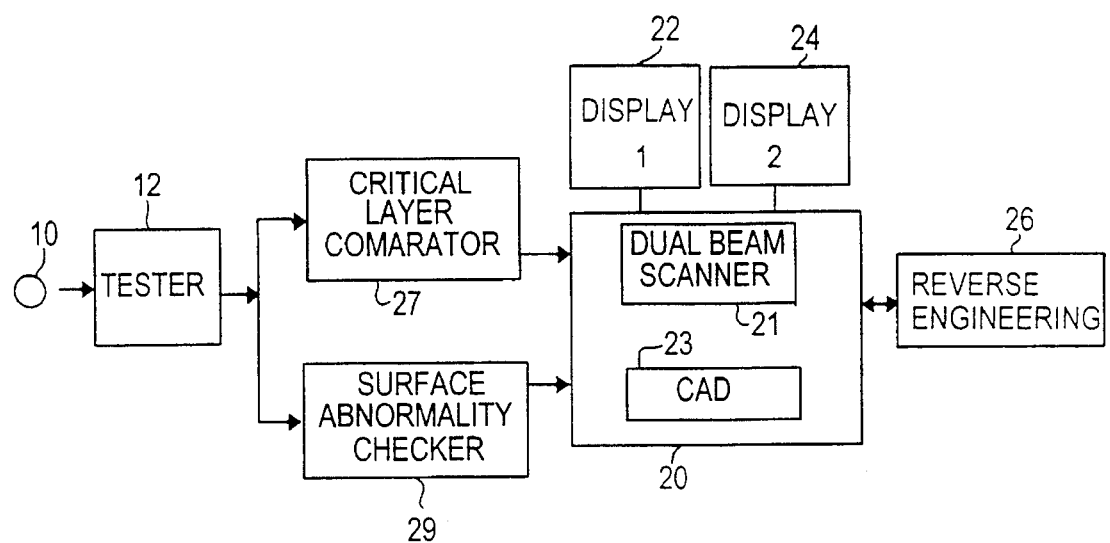
FIG. 4 is a block diagram of an alternative embodiment of the present invention.

An alternative embodiment of the present invention is depicted in FIG. 4. Instead of a hot spot generator 14, the embodiment of FIG. 4 uses a combination of defect inspection apparatus to locate area of interest. The first of these defect inspection apparatus is a critical layer comparator 27 manufactured by KLA Instrument Corp. of California, and essentially compares the layout of one die to an adjacent die. An embodiment of the critical layer comparator 27 comprises the 2130 image processing inspection tool, the 2608 review station and the 2551 data analysis, all manufactured by KLA. This critical layer comparator 27 requires a relatively long time to check a layer, and is therefore used only to check those layers that are considered critical to the integrated circuit.

The second defect inspection apparatus 29 is, for example, an 8510 TCP manufactured by Inspex Inc. of Massachusetts, and essentially operates by scanning a laser beam over a layer of a sample 10 to determine if there are any surface abnormalities, such as a hole or a particle. These abnormalities will be identified as possible failure sites and the coordinates of these sites can be stored. The inspection tool 20 may then use these stored coordinates for further inspection and to direct the reverse engineering process.

Once the failure site is identified, a chemical analysis known as EDX (electron dispersion X-ray) is performed at the location of interest. This chemical analysis identifies the material at the location of interest and may provide a determination of the cause of the failure. For example, the material at the location of interest may be identified as aluminum, when there should be no aluminum at that location.

Figure 3:
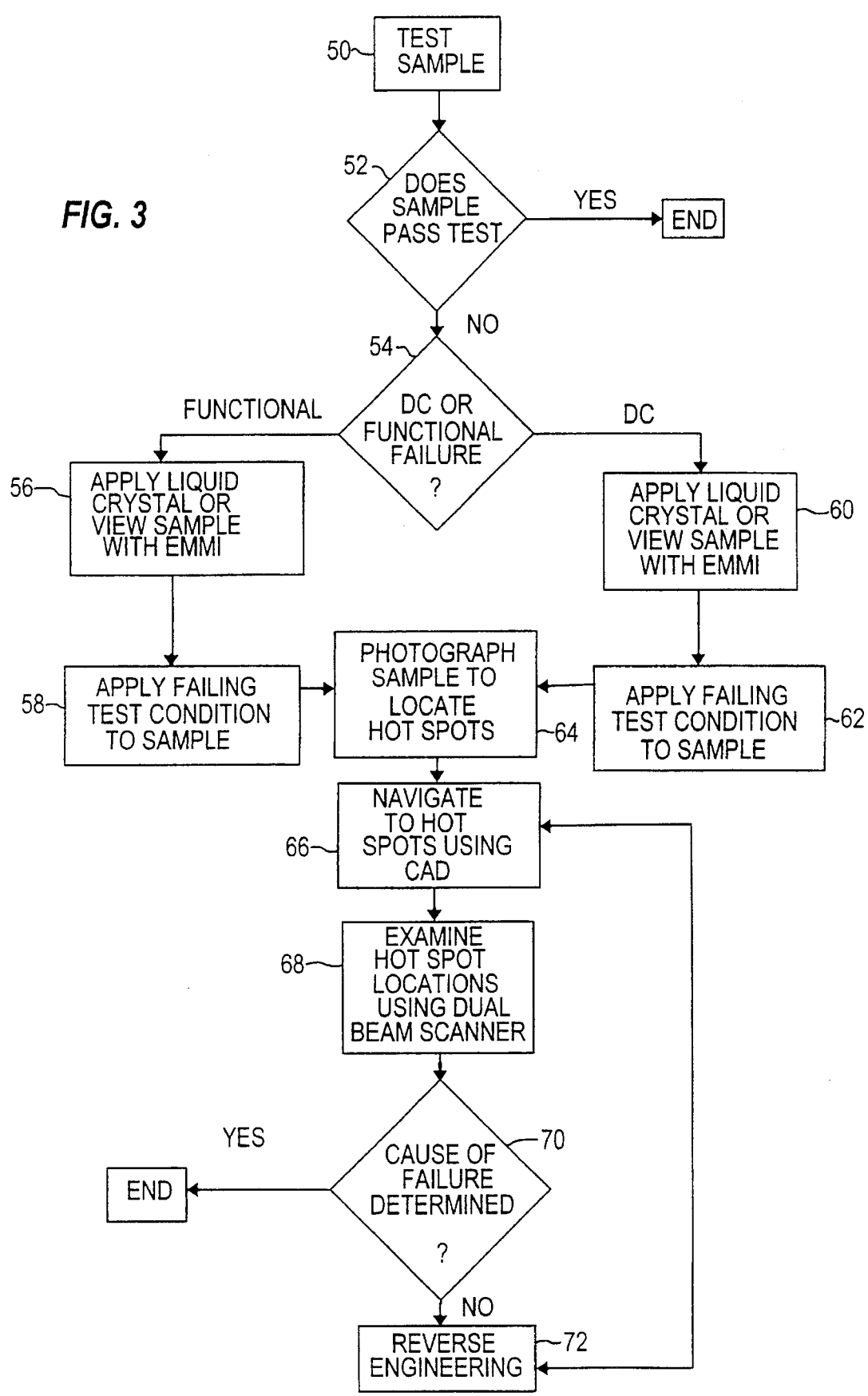
FIG. 3 is a flow chart of a method of analyzing the failure of a sample in accordance with an embodiment of the present invention.

Art embodiment of the method of the present invention is depicted in the flow chart of FIG. 3. This method includes a first step of testing the sample (step 50). In step 52, it is determined whether the sample passes the test. If the sample does pass the test, there is no failure analysis and the process is ended and a new sample may be tested. Assuming that the sample fails the test, it is determined in step 54 whether the failure is a functional failure or a DC failure.

In steps 56 and 60, either liquid crystal is applied to the sample or the sample is viewed through an emission microscope. In step 58 a function generator applies to the sample the test conditions which caused the sample to fail the initial test in order to create hot spots on the sample. This is also performed in step 62 to generate the hot spots in the sample.

When a part is failing, there is usually a localized problem with a device. There is therefore a heating up due to restricted current flow at the localized area of the device. The liquid crystal and the EMMI provide an indication of the location of these localized areas of heating (abnormal thermal emission sites).

The sample is photographed or otherwise optically recorded in step 64 to produce an optical recording of the location of the hot spots on the sample. In step 66, the inspection tool is used to navigate to the hot spot location using the computer aided design tool. Alternatively, the computer aided design tool 23 may be aligned to the stage of the EMMI 32 and the X and Y coordinates of the hot spot can be recorded for later inspection.

Once the navigation along the layout to the location of interest (the hot spot) is performed in step 66, these hot spot locations are examined using the FIB or SEM scanning beams of the dual beam scanner.

In step 70, it is determined whether the cause of the failure has been identified. If so, the method is completed and a new sample can be tested. Assuming that the initial inspection has not revealed the cause of the failure, reverse engineering is performed on the sample to either strip back a layer or produce a cross-section using the focused ion beam in step 72.

After the reverse engineering has been performed, the inspection tool 20 is used to navigate to the hot spot location with the use of the computer aided design tool in step 66. The hot spot locations are then examined once again using the dual beam scanner and it is once again determined whether the cause of the failure can be identified. This process is repeated until the cause of the failure is identified.

In an alternative embodiment of the method of the present invention using the apparatus depicted in FIG. 4, steps 56–64 are not necessary, as the locations of interest are determined using the defect inspection apparatus 27 and 29. After the locations of interest are identified by the defect inspection apparatus 27, 29, the inspection tool 20 again is used to navigate to the locations of interest which are then inspected (steps 66 and 68). The reverse engineering process then proceeds as in the method depicted in FIG. 3. After foreign particles are detected, the EDX technique described earlier may be performed immediately to identify the foreign particles. This allows corrective action to be taken in real-time manufacturing environments for a fast response.

Although the present invention has been described and illustrated in detail, it is to be clearly understood that the same is by way of illustration and example only and is not be taken by way of limitation, spirit and scope of the present invention being limited only by the terms of the appended claims.

We claim:

1. A method of analyzing a failure of a sample comprising the steps of:
   a) navigating over a layout of the sample to a location of interest using a computer aided design tool;
   b) inspecting the location of interest of the sample using a dual beam scanner;
   c) performing a reverse engineering process on the sample at the location of interest; and
   d) repeating steps a) and b) to determine a cause of the failure of the sample.

2. The method of claim 1, further comprising repeating step c, followed by the steps a and b if the cause of the failure of the sample cannot be determined in the step d; the repetition of steps c, a and b continuing until the cause of the failure of the sample is determined.

3. The method of claim 2, further comprising the step of locating a hot spot on the sample, the hot spot forming the location of interest.

4. The method of claim 3, wherein the step of locating the hot spot includes the steps of applying emission microscopy multilayer inspection to the sample, applying at least one of a generated function and a voltage to the sample, and capturing an optical image of the sample.

5. The method of claim 3, wherein the step of locating the hot spot includes the steps of applying liquid crystal to the sample, applying at least one of a generated function and a voltage to the sample, and capturing an optical image of the sample.

6. The method of claim 1, wherein the dual beam scanner includes a focused ion beam scanner and a scanning electron microscope.

7. The method of claim 6, further comprising the step of simultaneously displaying a first image produced by at least one of the focused ion beam scanner and the scanning electron microscope, and a second image produced by the computer aided design tool.

8. The method of claim 7, wherein the first and second images correspond to a same physical location of the sample.

9. The method of claim 6, wherein the reverse engineering process includes the step of removing material of the sample using the focused ion beam scanner.

10. The method of claim 1, wherein the reverse engineering process includes the step of dry etching of the sample.

11. The method of claim 1, wherein the reverse engineering process includes the step of wet etching of the sample.

12. The method of claim 1, further comprising the step of determining the location of interest by detecting abnormalities in the sample.

13. The method of claim 1, further comprising the step of determining the location of interest by comparing a layout design of the sample with an actual physical layout of the sample.

14. A method of determining a cause of a failure of an integrated circuit, comprising the steps of:

performing a reverse engineering processing of the integrated circuit at a suspected failure location;

navigating to the suspected failure location in the integrated circuit using a computer aided design tool; and inspecting the integrated circuit at the suspected failure location after the reverse engineering processing to determine the cause of the failure of the integrated circuit.

15. The method of claim 14, wherein the step of inspecting includes the step of scanning the integrated circuit with a dual beam scanner having a focused ion beam scanner and a scanning electron microscope.

16. The method of claim 15, further comprising the step of simultaneously displaying a first image of the integrated circuit produced by at least one of the focused ion beam scanner and the scanning electron microscope and a second image of the integrated circuit produced by the computer aided design tool.

17. The method of claim 16, further comprising the step of determining the suspected failure location prior to the step of performing the reverse engineering process.

18. The method of claim 17, wherein the step of determining the suspected failure location includes the step of identifying a hot spot in the integrated circuit in response to at least one of the function and a voltage applied to the integrated circuit.

19. The method of claim 18, wherein the step of performing the reverse engineering processing includes at least one of wet etching and dry etching the integrated circuit.

* * * * *